United States Patent [19]
Iino

[11] Patent Number: 6,130,543
[45] Date of Patent: Oct. 10, 2000

[54] INSPECTION METHOD AND APPARATUS FOR SEMICONDUCTOR INTEGRATED CIRCUIT, AND VACUUM CONTACTOR MECHANISM

[75] Inventor: Shinji Iino, Yamanashi-ken, Japan

[73] Assignee: Tokyo Electron Limited, Tokyo, Japan

[21] Appl. No.: 09/034,011

[22] Filed: Mar. 2, 1998

[30]      Foreign Application Priority Data

Mar. 7, 1997   [JP]   Japan ................................ 9-100881

[51] Int. Cl.$^7$ .............................................. G01R 31/02
[52] U.S. Cl. ............................................ 324/754; 324/765
[58] Field of Search ................................. 324/760, 765, 324/754, 761, 762

[56]           References Cited

U.S. PATENT DOCUMENTS

| | | | |
|---|---|---|---|
| 4,230,985 | 10/1980 | Matrone et al. | 324/755 |
| 4,352,061 | 9/1982 | Matrone | 324/755 |
| 4,636,722 | 1/1987 | Ardezzone | 324/754 |
| 4,777,716 | 10/1988 | Folk et al. | 29/593 |
| 5,089,772 | 2/1992 | Hatada et al. | 324/754 |
| 5,091,692 | 2/1992 | Ohno et al. | 324/754 |
| 5,237,267 | 8/1993 | Harwood et al. | 324/755 |
| 5,345,170 | 9/1994 | Schwindt et al. | 324/754 |
| 5,410,259 | 4/1995 | Fujihara et al. | 324/758 |
| 5,457,398 | 10/1995 | Schwind et al. | 324/754 |
| 5,510,724 | 4/1996 | Itoyama et al. | 324/760 |
| 5,532,609 | 7/1996 | Harwood et al. | 324/754 |
| 5,585,736 | 12/1996 | Hshieh et al. | 324/754 |
| 5,600,257 | 2/1997 | Leas et al. | 324/754 |
| 5,604,446 | 2/1997 | Sano | 324/758 |
| 5,610,529 | 3/1997 | Schwindt | 324/760 |
| 5,619,145 | 4/1997 | Matsuda | 324/754 |
| 5,640,100 | 6/1997 | Yamagata et al. | 324/754 |

FOREIGN PATENT DOCUMENTS 4-266041   9/1992   Japan .

*Primary Examiner*—Safet Metjahic
*Assistant Examiner*—Vincent Q. Nguyen
*Attorney, Agent, or Firm*—Oblon, Spivak, McClelland, Maier & Neustadt, P.C.

[57]           ABSTRACT

This vacuum contactor has a contactor body having on its lower surface a plurality of projecting terminals that can come into contact with electrodes of at least one chip formed on a wafer (W), and a dished space member through which the contactor body extends to be integrally supported. The dished space member forms a closed space including the projecting portions of the contactor body. An O-ring which comes into contact with the wafer (W) to form a closed space is arranged on the lower surface of the peripheral wall of the dished space member. The dished space member is connected to an exhaust path and an exhaust pipe. During inspection, the gas in the closed space is exhausted by the exhaust pipe to set the closed space at a low atmospheric pressure. A force that chucks the wafer (W) toward the closed space is applied to the wafer (W) by a suction force generated by the low atmospheric pressure. By this suction force, the respective electrodes of the wafer and the respective projecting terminals are brought into electrical contact with each other, thereby inspecting the chip.

15 Claims, 3 Drawing Sheets

INSPECTION METHOD AND APPARATUS FOR SEMICONDUCTOR INTEGRATED CIRCUIT, AND VACUUM CONTACTOR MECHANISM

BACKGROUND OF THE INVENTION

The present invention relates to an inspection method and apparatus for a semiconductor integrated circuit (to be referred to as a "chip" hereinafter) formed on a semiconductor wafer (to be referred to as a "wafer" hereinafter), and a vacuum contactor that can be used by them.

A semiconductor manufacturing process includes the step of inspecting a large number of chips formed on a wafer before dicing. As an inspection apparatus for inspecting the chips on the wafer one by one or a plurality of chips on the wafer in a batch, a probe apparatus is widely used. This probe apparatus generally has a wafer convey mechanism, a sub-chuck, a main chuck, a probe card, a connection ring, a performance board, and a test head. The wafer convey mechanism conveys the wafer one by one. The sub-chuck pre-aligns the wafer with reference to the orientation flat while the wafer is being conveyed by the wafer convey mechanism. The main chuck is movable in the X, Y, Z, and θ directions and receives the pre-aligned wafer through the convey mechanism. The probe card is arranged above the main chuck. The connection ring electrically connects the probe card and a tester to each other.

Inspection of the electrical characteristics of the wafer is performed by the step of moving the main chuck having the wafer placed thereon in the X, Y, Z, and θ directions to align the electrodes on the chips of the wafer and the measuring contacts (e.g., probe pins) of the probe card with each other, the step of over-driving the main chuck in the Z direction to bring the electrodes of the wafer into electrical contact with the probe pins, and the step of inspecting the electrical characteristics of the respective chips based on inspection signals output from the probe pins while the probe pins and the electrodes are in contact with each other.

Recently, as the integration degree of the semiconductor integrated circuits has advanced sharply, the number of electrodes has increased, and the number of probe pins that are brought into contact with the electrodes has become as large as 2,000. To achieve conduction between the electrodes and the probe pins, for example, a pressure of 5 g is applied to each probe pin. When the number of probe pins reaches as large as 2,000, as described above, the total pressure applied to all the probe pins becomes about 10 kg. The main chuck must be able to apply this pressure to the probe pins. When the main chuck applies this pressure, a local pressure (local load) acts on the main chuck to incline it albeit slightly. Then, because of size reduction of the electrodes as well, at least some probe pins are dislodged from the electrode positions to degrade the inspection precision.

In the conventional contactor method wherein the main chuck is over-driven in the Z direction to bring the probe pins and the electrode pads into tight contact with each other, since it is difficult to eliminate this local load itself, a measure must be taken for the local load of the main chuck. If, for example, the rigidity of the main chuck is increased as a measure against the local load, the main chuck and the like become more and more heavy, and the cost increases.

BRIEF SUMMARY OF THE INVENTION

The present invention has been made in order to solve the above problem, and has as its object to provide an inspection method and apparatus for a semiconductor integrated circuit, and a vacuum contactor, that can perform electrical inspection of the respective semiconductor elements at high precision.

According to one aspect of the present invention, there is provided an inspection method of inspecting electrical characteristics of semiconductor integrated circuits formed on a semiconductor wafer, the method comprising the contacting step of moving a main chuck, on which the semiconductor wafer is placed, toward a contactor having a plurality of measuring contacts that come into contact with electrodes of at least one of the semiconductor integrated circuits which are formed on the semiconductor wafer and which have a plurality of electrodes, thereby bringing the measuring contacts and the electrodes into contact with each other, and the inspection step of inspecting the electrical characteristics of each of the semiconductor integrated circuits based on inspection data output from the measuring contacts while the measuring contacts and the electrodes are in contact with each other, characterized in that the contacting step comprises the step of moving the main chuck toward the contactor until a gap between the main chuck and contactor becomes the one which is present immediately before the measuring contacts and the electrodes come into contact with each other, and the step of setting a pressure of the gap between the main chuck and the contactor to a low pressure and moving the contactor and the semiconductor wafer on the main chuck closer to each other with a suction force generated by the low pressure, thereby bringing the measuring contacts and the electrodes into contact with each other.

Furthermore, in the inspection step, the temperature of the semiconductor integrated circuits under measurement can be detected, and the temperature of the main chuck can be controlled based on the detected temperature.

According to another aspect of the present invention, there is provided an inspection apparatus comprising a contactor having a plurality of measuring contacts, a main chuck for placing thereon a semiconductor having a surface where semiconductor integrated circuits having a plurality of electrodes are formed, contacting means for causing the electrodes of the semiconductor integrated circuits on the semiconductor wafer placed on the main chuck and the measuring contacts of the contact to come into contact with each other, tester means for inspecting the electrical characteristics of the semiconductor integrated circuits, and connecting means for connecting the tester means and the electrodes of the semiconductor integrated circuits to each other through the measuring contacts, characterized in that the contacting means comprises a vacuum contactor mechanism.

The vacuum contactor mechanism preferably has a dished space member formed in a lower surface of the contactor, a main chuck moving mechanism, and an exhaust unit. The dished space member has a flat peripheral surface around it and measuring contacts in it so as not to project from it. The peripheral surface of the dished space member moves close to an upper surface of the semiconductor wafer placed on the main chuck to form a closed space surrounded by the dished space member and a surface of the semiconductor wafer. The main chuck moving mechanism moves the main chuck toward the contactor to move the upper surface of the semiconductor wafer placed on the main chuck close to the peripheral surface of the dished space member of the contactor. The exhaust unit is connected to the dished space member of the contactor, exhausts a gas in the closed space formed by the dished space member of the contactor and the upper surface of the semiconductor wafer to set an interior of the closed space to a low pressure, and moves the contactor and the semiconductor closer to each other with a suction force generated by the low pressure, thereby bringing the measuring contacts and the electrodes into contact with each other.

The contactor preferably comprises a contactor body having a plurality of measuring contacts and a support for supporting the contactor body.

The support of the contactor preferably comprises an upper member and a lower member. The upper and lower members are elastically connected to each other through a plurality of elastic members. The lower member supports the contactor body which extends through it at its central portion, and has a dished space member in its lower surface to accommodate the contactor body. The peripheral surface of the dished space member has such a height that the measuring contacts of the contactor body do not project from it, and moves close to the upper surface of the semiconductor wafer placed on the main chuck to form a closed space together with the dished space member and the semiconductor wafer.

The peripheral surface of the dished space member formed in a lower surface of the lower member is preferably formed with a seal member for improving contact with a surface of the semiconductor wafer.

The connecting means for connecting the tester means and the electrodes of the semiconductor integrated circuits to each other through the measuring contacts is preferably a flexible printed circuit board.

The upper plate-like member is preferably a performance board.

The elastic members for elastically connecting the upper and lower plate-like members to each other are preferably leaf springs.

At least the contactor body of the contactor is preferably made of a material having a thermal expansion coefficient which is close to that of the semiconductor wafer.

The measuring contacts are preferably projecting terminals.

The semiconductor wafer preferably has a temperature sensor, and the contactor preferably has a contact for receiving a temperature detection signal from the temperature sensor.

An upper surface of the main chuck is preferably formed with a heat conductive sheet.

According to still another aspect of the present invention, there is provided a vacuum contactor mechanism comprising a contactor body having, on its lower surface, a plurality of projecting terminals that can come into contact with electrodes of at least one semiconductor element on a semiconductor wafer, a dished space member for supporting the contactor body such that the contactor body extends through it and forming a space that includes a portion of the contactor body that extends through the dished space member to project from it, a seal member formed on a lower surface of a peripheral wall of the dished space member to come into contact with the semiconductor wafer, thereby maintaining air tightness of the space, and exhaust means, characterized in that, during inspection, a gas in the airtight space formed by the dished space member and the semiconductor wafer is exhausted by the exhaust means to vacuum-chuck the semiconductor wafer and to bring the electrodes and corresponding ones of the projecting terminals into contact with each other.

The contactor body is preferably electrically connected to the performance board through the flexible printed circuit board, and the dished space member is preferably connected to the performance board through a leaf spring.

The contactor body is preferably made of a material having a thermal expansion coefficient which is close to that of the semiconductor wafer.

The present invention can provide a vacuum contactor mechanism which can perform highly precise electrical inspection of semiconductor elements by bringing the electrodes of a semiconductor wafer and contact terminals into accurate contact with each other without applying a local load to a main chuck.

In the present invention, the measuring contacts may be contacts that inspect the electrical characteristics of the individual integrated circuits formed on the semiconductor wafer one by one, or may be contacts that inspect the electrical characteristics of a plurality of integrated circuits in a batch. The measuring contacts may be any means, e.g., projecting terminals such as bump electrodes or probe needles, that can come into electrical contact with the electrodes to transmit an electrical signal between the integrated circuits and the tester.

In the present invention, the contactor and the semiconductor wafer are moved closer to each other by the suction force generated by the low pressure between them. To achieve this, the semiconductor wafer may be moved, the contactor may be moved, or both of them may be moved closer to each other.

The vacuum contactor mechanism according to the present invention can be any mechanism as far as it moves the contactor and semiconductor wafer close to each other by utilizing a suction force generated by a low atmospheric pressure to bring the measuring contacts of the contactor and the electrodes of the semiconductor wafer into contact with each other.

The vacuum contactor mechanism can be either one of a mechanism which moves the semiconductor wafer toward the contactor, a mechanism which moves the contactor toward the semiconductor wafer, or a mechanism which moves both the semiconductor wafer and the contactor close to each other.

The connecting means according to the present invention can be any means as far as it electrically connects the tester means and the electrodes of the semiconductor integrated circuits through the measuring contacts. As the connecting means, a flexible printed circuit board is preferable, and connecting means utilizing an electric wire can also be employed instead.

The dished space member formed in the lower surface of the contactor according to the present invention can have any structure as far as the measuring contacts can be arranged in it so as not to project from the dished space member. For example, a structure in which a dished space member is integrally formed with the contactor, or a structure in which a dished space member is formed by adding a frame-like member to the lower surface of the contactor can be employed. The contactor of the present invention can have an entirely integral structure or a structure that can be assembled and disassembled. In particular, the contactor of the present invention can be integral with the contactor body where the measuring contacts are to be arranged, or the contactor body may be assembled in the contactor of the present invention.

The closed space according to the present invention signifies a space defined by the dished space member and the upper surface of the semiconductor wafer which is formed when the flat peripheral surface of the dished space member and the upper surface of the semiconductor wafer move close to each other. Moving close to each other preferably signifies coming into tight contact with each other, but a small gap may be allowed. The peripheral surface of the dished space member may be an almost completely flat surface or a flat surface having some unevenness.

The plurality of elastic members according to the present invention can be any means, e.g., leaf springs or wire springs, as far as they have elasticity.

The upper and lower members according to the present invention can have any structure as far as they are combined together to serve as a support. The upper and lower members can have a plate-like structure.

The seal member according to the present invention can be made of any material and can have any structure as far as it can improve, even slightly, the contact between the peripheral surface of the dished space member and the surface of the semiconductor wafer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
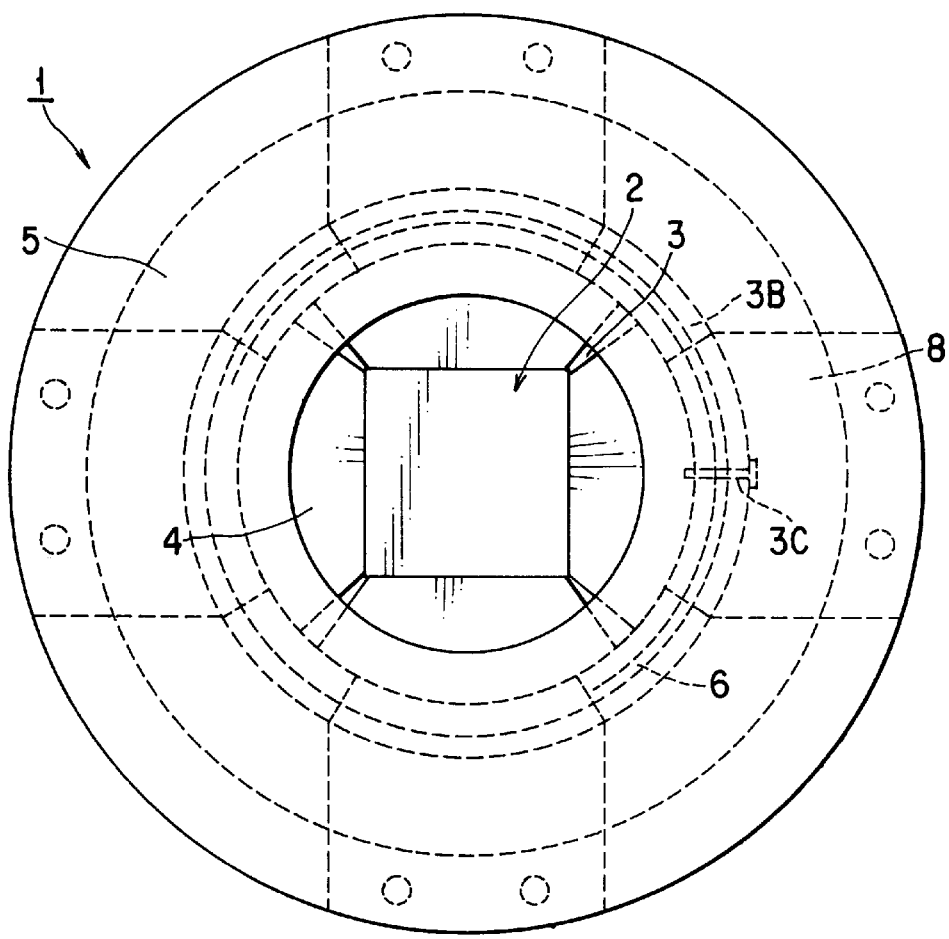
FIG. 1 is a plan view showing a contactor according to an embodiment of the present invention.
Figure 2:
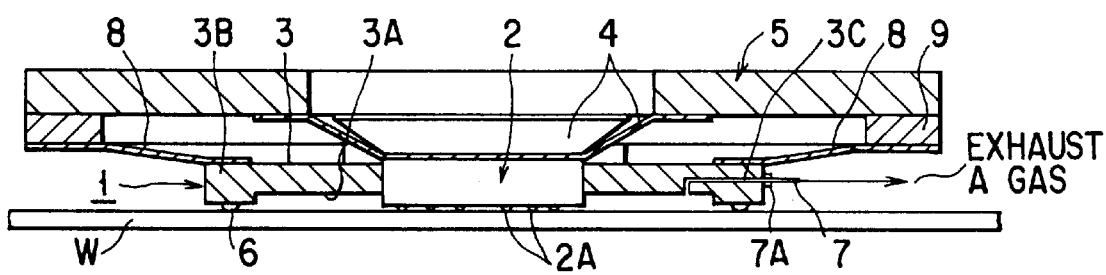
FIG. 2 is a sectional view of the contactor shown in FIG. 1.

FIGS. 1 and 2 show a vacuum contactor according to an embodiment of the present invention. Note that the invention of the present application is not limited to this embodiment. A vacuum contactor 1 is constituted by a contactor body 2 and a support that integrally supports the contactor body 2, and can be applied to a probe apparatus (to be described later). In this embodiment, the support is constituted by a performance board 5 serving as an upper member and a dished space member 3 serving as a lower member. The contactor body 2 is made of a material (e.g., a ceramic member or silicon) having a thermal expansion coefficient which is substantially the same as or close to that of a wafer W, and has high rigidity. Although the contactor body 2 can be formed into a rectangular shape having a side of 20 mm, it can be formed into any shape, e.g., a circular shape.

Measuring contacts (projecting terminals) 2A that come into contact with the electrodes of integrated circuits formed on the wafer are formed on the lower surface of the contactor body 2. In this embodiment, the measuring contacts are projecting terminals 2A. The number and positions of the measuring contacts 2A are selected as required in accordance with the inspection method used, i.e., whether the integrated circuits formed on the wafer are to be inspected one by one, or in a batch including a plurality of integrated circuits. Connection terminals (not shown) corresponding to the projecting terminals 2A are formed on the upper surface of the contactor body 2 into a plurality of rows along, e.g., four sides. The respective projecting terminals and connection terminals are connected to each other through an interconnection layer (not shown) formed in the contactor body 2. The respective connection terminals of the contactor body 2 are connected to the performance board 5 through an electrical connecting means 4 (e.g., four flexible printed circuit boards). Each flexible printed circuit board 4 is preferably formed into a nearly fan shape. One end of each flexible printed circuit board 4 is connected to the connection terminals arranged on the upper surface of the contactor body 2, and its other end is connected to the connection terminals arranged arcuately on the lower surface of the performance board 5. The four flexible printed circuit boards 4 radially extend from the four sides of the contactor body 2. The dished space member 3 is made of a metal, e.g., stainless steel, having good corrosion resistance. As shown in FIGS. 1 and 2, the dished space member 3 is formed into a flat cap having a dished space 3A. The outer diameter of the dished space member 3 is, e.g., 50 mm. A flat peripheral surface is formed on a peripheral wall 3B around the dished space 3A. A seal member 6 (e.g., an O-ring made of silicone rubber or the like) is mounted on this peripheral surface. The dished space member 3 comes into contact with the wafer W through the O-ring 6. A hole is formed at the central portion of the dished space member 3. The contactor body 2 extends through this hole and is integrally supported by the dished space member 3. The respective projecting terminals 2A are formed on the lower surface of the contactor body 2 such that they do not project from the dished space 3A of the dished space member 3 or from the O-ring 6. Accordingly, while the dished space member 3 is in light contact with the wafer W through the O-ring 6, the projecting terminals 2A cannot come into contact with the electrodes of the wafer W. An exhaust path 3C is formed in the dished space member 3 to extend through, e.g., the peripheral wall. An exhaust pipe 7 is connected to the outer opening of the exhaust path 3C through a connecting member 7A. The exhaust pipe 7 is connected to an exhaust unit (not shown). The exhaust unit exhausts a gas in the dished space member 3. Under the control of a controller (not shown), the exhaust unit is driven, when the wafer W is to be inspected, to exhaust the gas in the closed space formed by the wafer W and the dished space member 3 to set this closed space at a low atmospheric pressure. The wafer W is chucked toward the dished space member 3A by a suction force generated by the low atmospheric pressure, and the respective electrodes of the chips formed on the wafer W come into contact with the corresponding projecting terminals 2A.

The dished space member 3 is connected to the performance board 5 through an elastic member 8 (e.g., a plurality of metal leaf springs). The leaf springs 8 can be formed into substantially rectangular shapes, and the number of leaf springs 8 can be set to, e.g., 3 or 4. One end of each leaf spring 8 is fixed (e.g., welded) to the upper surface of the dished space member 3, and its other end is fixed to an annular member 9 fixed to the lower surface of the performance board 5. The plurality of leaf springs 8 extend radially from the dished space member 3. Since the dished space member 3 is suspended from the performance board 5 through the leaf springs 8, no excessive tension acts on the flexible printed circuit boards 4.

During inspection, a main chuck (e.g., a main chuck 15) (FIG. 3) on which the wafer W is placed moves upward toward the vacuum contactor 1, and the wafer W comes close to or into contact with the O-ring 6 of the dished space member 3. The dished space member 3A of the dished space member 3 and the wafer W form a closed space.

An example of the inspection apparatus (probe apparatus) for a semiconductor integrated circuit to which the vacuum contactor 1 is applied will be described with reference to FIG. 3.

Figure 3:
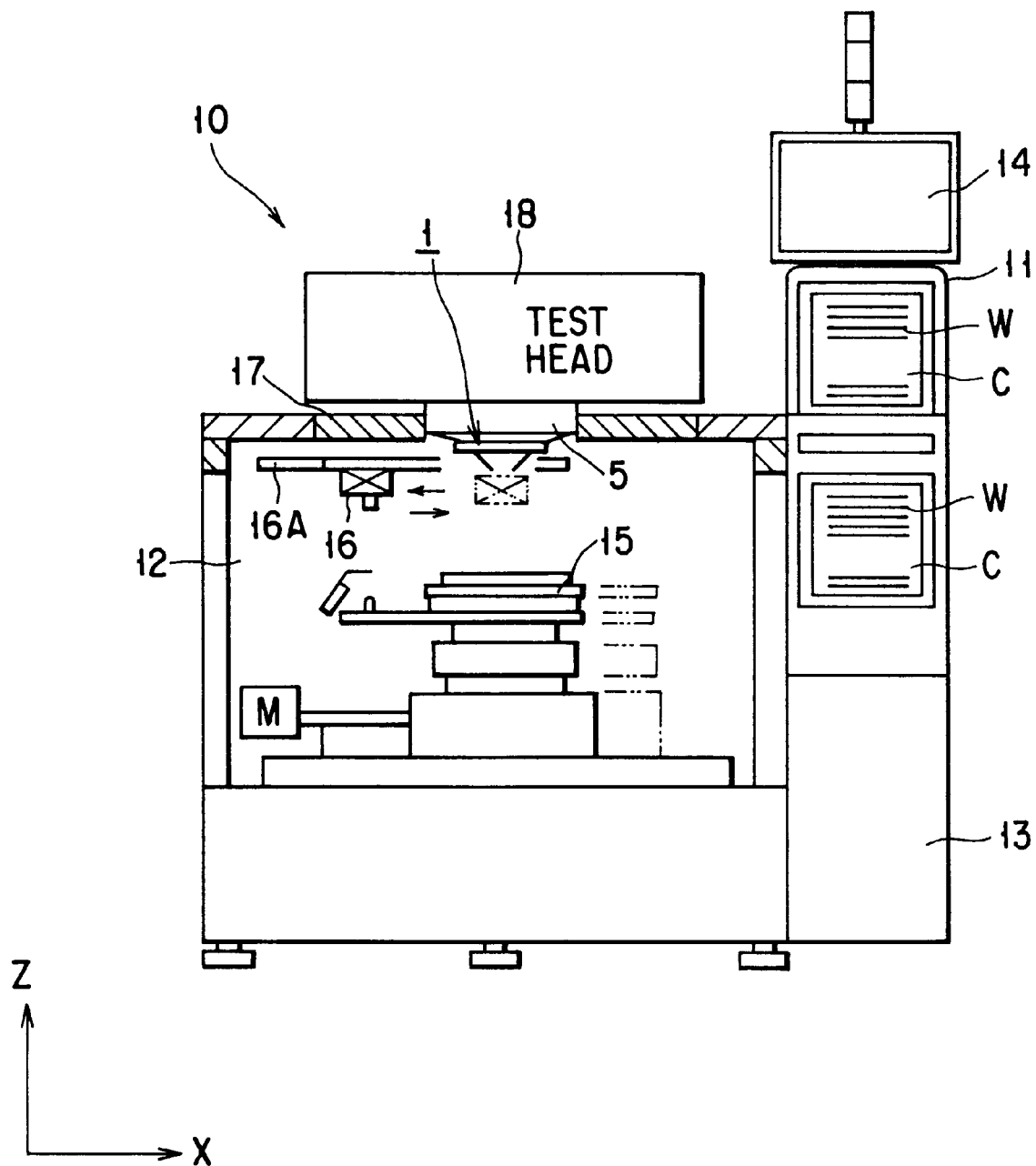
FIG. 3 is a sectional view of the main part of an example of a probe apparatus to which the contactor shown in FIG. 1 is applied.

As shown in FIG. 3, a probe apparatus 10 has a loader portion 11, a prober portion 12, a controller 13, and a display 14. The loader portion 11 conveys the wafer W disposed in a cassette C. The prober portion 12 inspects the wafer W conveyed from the loader portion 11. The prober portion 12 and loader portion 11 are controlled by the controller 13. The display 14 also serves as an operation panel for operating the controller 13.

A sub-chuck (not shown) is disposed in the loader portion 11. The sub-chuck pre-aligns the wafer W with reference to an orientation flat of the wafer W. The pre-aligned wafer W is conveyed to the prober portion 12 through a convey mechanism.

The prober portion 12 has a main chuck 15, an alignment mechanism 16, the vacuum contactor 1, and a test head 18. The main chuck 15 is movable in the X, Y, Z, and θ directions. The alignment mechanism 16 has an alignment bridge 16A and the like for accurately aligning the wafer W, placed on the main chuck 15, on the inspection position. The vacuum contactor 1 is required for electrically inspecting the wafer W aligned by the alignment mechanism 16. The vacuum contactor 1 has the performance board 5. The vacuum contactor 1 is arranged in the central hole of a head plate 17.

The exhaust pipe 7 (FIG. 2) of the vacuum contactor 1 is connected to the exhaust unit (not shown) located under the prober portion 12 through, e.g., the lower surface of the head plate 17 and the side surface of the prober portion 12.

The test head 18 is swingably disposed on the prober portion 12. The test head 18, which has swung on the prober portion 12 to be located at the position shown in FIG. 3, comes into electrical contact with the vacuum contactor 1 through the performance board 5. The test head 18 transmits a measurement signal from the tester (not shown) to the electrodes of the wafer W on the main chuck 15 through the performance board 5 and the projecting terminals 2A (FIG. 2) of the contactor body 2. The measurement signal from the wafer W is sent to the tester through a reverse path. The tester analyzes the measurement signal to inspect the chips on the wafer W one by one, or in a batch of a plurality of chips.

Figure 4:
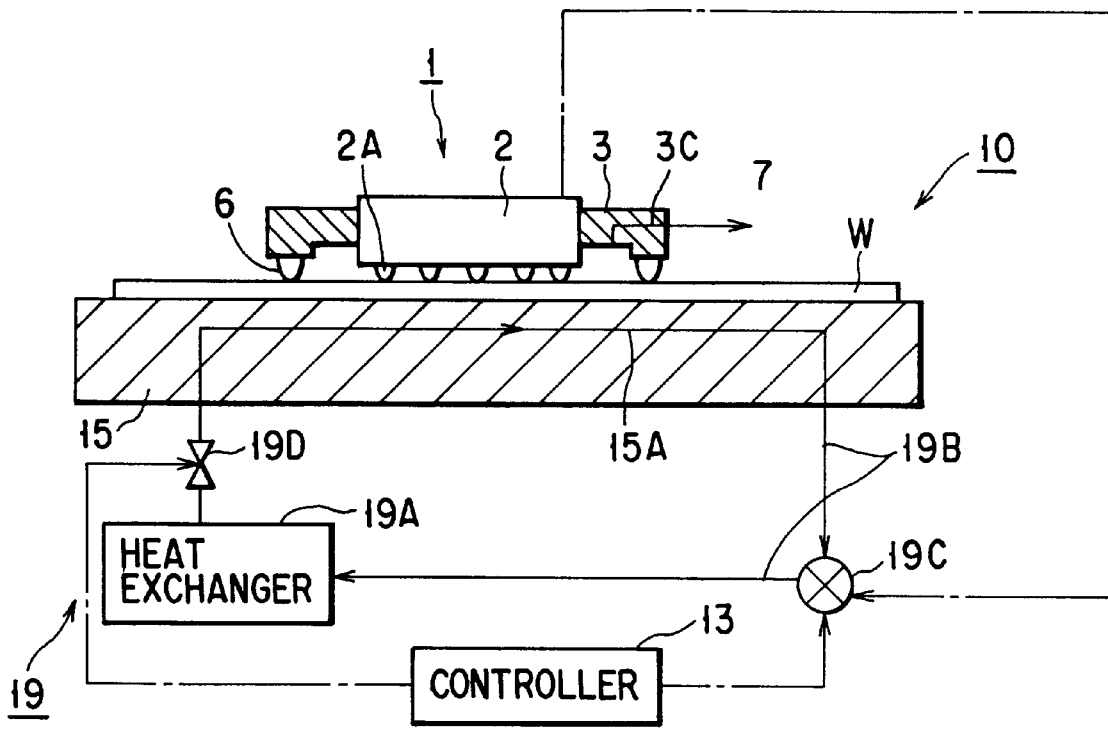
FIG. 4 is a main part sectional view showing a state wherein a wafer is inspected by using the probe apparatus shown in FIG. 3.

The probe apparatus 10 can control the temperature of the wafer W within the range of −55° C. to 150° C. The mechanism for this control is shown in FIG. 4. A coolant path 15A through which a coolant (e.g., ethylene glycol solution) flows is formed in the main chuck 15. A cooling mechanism 19 is connected to the coolant path 15A. The cooling mechanism 19 has a heat exchanger 19A for cooling the coolant to a predetermined low temperature, and coolant pipes 19B for connecting the heat exchanger 19A and the coolant path 15A to each other. The coolant path 15A and coolant pipes 19B form a circulation path for the coolant. A pump 19C and a solenoid valve 19D are disposed in the coolant pipes 19B. During inspection of the wafer W, the wafer W can be cooled down to a predetermined temperature with the coolant circulated by the pump 19C under the control of the controller 13. Furthermore, a heating means (e.g., a surface heater) (not shown) is included in the main chuck 15. Under the control of the controller 13, the wafer W can be heated by the surface heater to a predetermined high temperature.

A plurality of concentric grooves (not shown) are formed in the surface of the main chuck 15, and holes for vacuum chucking are formed at plurality of portions in the respective grooves. The wafer W is vacuum-chucked to the main chuck 15 side through these holes, and is fixed on the main chuck 15.

The inspection method will be described. Inspection of the wafer W includes low-temperature inspection, room-temperature inspection, and high-temperature inspection. Although low-temperature inspection will be described, other inspections can be performed in the same manner as low-temperature inspection. Referring to FIG. 3, the probe apparatus 10 is controlled by the controller 13. The convey mechanism is driven in the loader portion 11, and the convey mechanism extracts one wafer W from the cassette C and places it on the sub-chuck. The wafer W is pre-aligned with reference to its orientation flat. Thereafter, the convey mechanism receives the wafer W on the sub-chuck and moves it onto the main chuck 15 in the prober portion 12.

The main chuck 15 vacuum-chucks the wafer W and fixes it on the main chuck 15. After that, the main chuck 15 moves in the X, Y and θ directions and cooperates with the alignment mechanism 16 to align the electrodes of the wafer W with the projecting terminals 2A of the contactor body 2.

The main chuck 15 moves upward toward the vacuum contactor 1. The main chuck 15 stops when the wafer W comes into contact with the O-ring 6 against the spring force of the leaf springs 8 of the vacuum contactor 1.

The wafer W is pressed against the main chuck 15 by the spring force of the leaf springs 8. As shown in FIG. 4, the dished space member 3 moves close to the wafer W to form a closed space together with the wafer W. At this time, a gap is formed between the projecting terminals 2A of the contactor body 2 and the measurement electrodes of the wafer W.

Under the control of the controller 13, the solenoid valve 19D is opened and the pump 19C is driven. The coolant (e.g., ethylene glycol solution) cooled by the heat exchanger 19A circulates through the coolant pipes 19B and the coolant path 15A in the main chuck 15.

The gas in the gap between the projecting terminals 2A of the contactor body 2 and the measurement electrodes of the wafer W, i.e., the gas in the closed space defined by the dished space member 3 and wafer W is exhausted to set this closed space at a low atmospheric pressure. The wafer W on the main chuck 15 is chucked to the dished space member 3 side by the suction force generated by the low atmospheric pressure. Then, the O-ring 6 compression-deforms, and the respective projecting terminals 2A of the vacuum contactor 1 come into contact with the electrodes of the wafer W to be in electrical contact with them. At this time, a force that pushes the wafer W toward the dished space member 3 acts on the wafer W. Since the dished space member 3 is pressed against the main chuck 15 by the leaf springs 8, the wafer W will not separate from the main chuck 15.

As a result, the contact pressure between the wafer W and the main chuck 15 is kept low, any inclination of the main chuck 15 caused by a load is reduced, and alignment of the measurement electrodes with the projecting terminals 2A is maintained at high precision. Thereafter, the tester transmits a measurement signal to the respective electrodes of the wafer W through the performance board 5 and vacuum contactor 1. The electric characteristics of one or a plurality of chips are measured based on this measurement signal. The measurement result is transmitted to the tester, and the respective chips are inspected by the tester one by one or in a batch of a plurality of chips. The chips generate heat during measurement. However, since the wafer W is cooled by the ethylene glycol solution, the chips can be inspected at a predetermined low temperature. After the inspection is ended, the coolant pipes 19B are closed by the solenoid valve 19D, and the exhaust unit is stopped. The closed space in the dished space member 3 is restored to normal pressure, the main chuck 15 moves downward, and the wafer W separates from the vacuum contactor 1.

Subsequently, the main chuck 15 is index-fed in order to inspect the next chip. When inspection for all the chips on the wafer W is ended, the main chuck 15 moves to the loader portion 11, and the wafer W is returned into the cassette C along the reverse path to that during loading. The next wafer W is inspected in accordance with the same method as described above.

As described above, according to this embodiment, the exhaust unit exhausts the gas in the closed space formed by the dished space member 3 and wafer W, and a force that chucks the wafer W to the closed space side acts on the wafer W. By this suction force, the electrodes of the wafer W are moved close to the projecting terminals 2A of the vacuum contactor 1 to come into contact with them. Unlike in the conventional case, the main chuck 15 will not be over-driven and strongly pressed against the contactor. Accordingly, the measure for the local load described above becomes unnecessary, and an increase in cost is suppressed, while the inspection can be performed stably and accurately.

When the wafer W is vacuum-chucked in the dished space member 3, the wafer W moves to the dished space member 3 side only by a distance corresponding to the amount of compression deformation of the O-ring 6. Therefore, no extra needle pressure acts on the projecting terminals 2A to prevent damage to them, thereby increasing the physical stability and lifetime of the projecting terminals 2A.

The projecting terminals 2A are arranged on the entire lower surface of the vacuum contactor body 2. Hence, the projecting terminals 2A come into contact with the measurement electrode pads formed in the chips as well with a uniform pressure, so that highly precise electrical inspection can be performed.

The vacuum contactor body 2 is preferably made of a material (silicon) having a thermal expansion coefficient which is the same as or close to that of a wafer W. Even if the wafer W is cooled or heated during inspection, the vacuum contactor body 2 which has come into contact with the wafer W is also cooled or heated to the same degree to follow the thermal shrinkage or expansion of the wafer W. Thus, the respective projecting terminals 2A can come into contact with the corresponding measurement electrodes accurately to perform highly precise electrical inspection.

Figure 5:
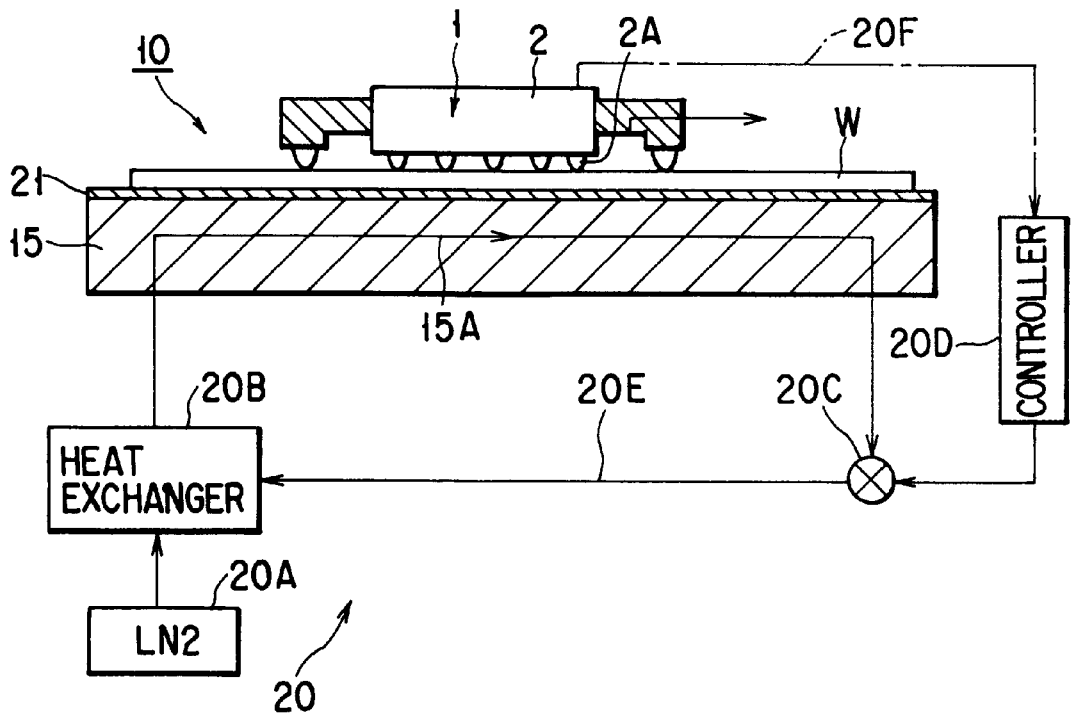
FIG. 5 is a sectional view, corresponding to FIG. 4, showing a state wherein a wafer is inspected by using a contactor according to another embodiment of the present invention.

FIG. 5 shows the main part of a probe apparatus 10 to which a vacuum contactor 1 according to another embodiment of the present invention is applied. This probe apparatus 10 has the same arrangement as that of the probe apparatus 10 of the above embodiment except for its vacuum contactor 1 and the cooling mechanism of its main chuck 15. A cooling mechanism 20 used by this probe apparatus 10 has a coolant supply source 20A, a heat exchanger 20B, a coolant path 15A in the main chuck 15, a pump 20C, and a temperature controller 20D. The heat exchanger 20B and coolant path 15A, the coolant path 15A and pump 20C, and the pump 20C and heat exchanger 20B are respectively connected through pipes 20E to form a coolant circulation path.

The vacuum contactor 1 of this embodiment can be formed with projecting terminals 2A that come into contact with the temperature sensors formed on the respective chips of a wafer W. The projecting terminals 2A are connected to the temperature controller 20D through a wire 20F. During inspection, the projecting terminals 2A of the vacuum contactor 1 come into contact with the temperature sensors of the chips, and a detection signal from the temperature sensors is fed back to the temperature controller 20D through the wire 20F. The circulation amount of coolant in the circulation path is controlled based on this detection signal, and the temperature of the wafer W can be maintained at a predetermined low temperature.

For example, a heat conductive sheet (e.g., Thercon [product name; manufactured by Fuji Kobunshi Kogyo K. K.]) 21 (FIG. 5) is extended on the upper surface of the main chuck 15. The heat conductive sheet 21 improves the heat transfer coefficient.

In this embodiment, the chip temperature is quickly detected through the temperature sensor, and the wafer W is controlled based on the detection signal. Therefore, the chip temperature can be controlled precisely.

The present invention is not limited to the embodiments described above, but can be applied to any apparatus and method with which the electrodes of the wafer W and the projecting terminals are brought into contact with each other by any vacuum contactor mechanism. The design of the vacuum contactor mechanism can be appropriately changed as required.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An inspection method of inspecting electrical characteristics of semiconductor integrated circuits formed on a semiconductor wafer, said method comprising:

the contacting step of moving a main chuck, on which the semiconductor wafer is placed, toward a contactor having a plurality of measuring contacts that come into contact with electrodes of at least one of the semiconductor integrated circuits which are formed on the semiconductor wafer and which have a plurality of electrodes, thereby bringing said measuring contacts and the electrodes into contact with each other, and the inspection step of inspecting the electrical characteristics of each of the semiconductor integrated circuits based on an inspection signal output from said measuring contacts while said measuring contacts and the electrodes are in contact with each other, wherein the contacting step comprises:

the step of moving said main chuck toward said contactor until a gap between said semiconductor wafer and said contactor becomes the one which is present immediately before said measuring contacts contact the electrodes; and the step of setting a pressure of the gap between said semiconductor wafer and said contactor to a low pressure and moving said contactor and the semiconductor wafer on the main chuck closer to each other with a suction force generated by the low pressure, thereby bringing said measuring contacts and the electrodes into contact with each other, wherein the suction force generated by the low pressure occurs due to exhausting a gas from the gap.

2. The inspection method according to claim 1, wherein said inspection step further comprises detecting a temperature of the semiconductor integrated circuits under measurement and controlling a temperature of said main chuck based on the detected temperature.

3. An inspection apparatus comprising:

a contactor having a plurality of measuring contacts;

a main chuck for placing a semiconductor wafer thereon, the semiconductor wafer having a surface where semiconductor integrated circuits having a plurality of electrodes are formed;

contacting means for causing the electrodes of the semiconductor integrated circuits on the semiconductor wafer placed on said main chuck and said measuring contacts of said contactor to come into contact with each other;

tester means for inspecting the electrical characteristics of the semiconductor integrated circuits; and connecting means for connecting said tester means and the electrodes of said semiconductor integrated circuits to each other through said measuring contacts, wherein said contacting means comprises a vacuum contactor mechanism, and wherein said vacuum contactor mechanism further comprises:

a dished space member supporting said contactor, said dished space member having a flat peripheral surface around the dished space member and measuring contacts therein so as not to project therefrom, and said peripheral surface of said dished space member coming into contact with an upper surface of the semiconductor wafer placed on said main chuck via a sealed member formed on a lower surface of a peripheral wall of said dished spaced member to form a closed space surrounded by said dished space member and a surface of the semiconductor wafer;

a main chuck moving mechanism configured to move said main chuck toward said contactor to move the upper surface of the semiconductor wafer placed on said main chuck close to said peripheral surface of said dished space member of said contactor; and an exhaust unit connected to said dished space member of said contactor and serving to exhaust a gas in said closed space formed by said dished space member of said contactor and the upper surface of the semiconductor wafer to set an interior of said closed space to a low pressure, and to move said contactor and the semiconductor wafer closer to each other with a suction force generated by the low pressure, thereby bringing said measuring contacts and the electrodes into contact with each other, said vacuum contactor mechanism setting a pressure of a gap between the main chuck and said contactor to a low pressure and moving said contactor and the semiconductor wafer on the main chuck closer to each other with a suction force generated by the low pressure, thereby bringing said measuring contacts and electrodes into contact with each other.

4. An inspection apparatus according to claim 3, wherein said semiconductor wafer has a temperature sensor, and said contactor has a contact for receiving a temperature detection signal from said temperature sensor.

5. An inspection apparatus according to claim 3, wherein an upper surface of said main chuck is formed with a heat conductive sheet.

6. An inspection apparatus according to claim 3, wherein said contactor comprises a contactor body having a plurality of measuring contacts and a support for supporting said contactor body.

7. An inspection apparatus according to claim 6, wherein said connecting means for connecting said tester means and the electrodes of the semiconductor integrated circuits to each other through said measuring contacts is a flexible printed circuit board.

8. An inspection apparatus according to claim 6, wherein at least said contactor body of said contactor is made of a material having a thermal expansion coefficient which is close to that of the semiconductor wafer.

9. An inspection apparatus according to claim 6, wherein said support of said contactor has an upper plate member and a lower plate member, said upper and lower plate members being elastically connected to each other through a plurality of elastic members, said lower plate member serving to support said contactor body extending therethrough at a central portion thereof and having a dished space member in a lower surface thereof to accommodate said contactor body, and said peripheral surface of said dished space member having a height with which said measuring contacts of said contactor body do not project therefrom and moving closer to the upper surface of the semiconductor wafer placed on said main chuck to form a closed space together with said dished space member and the semiconductor wafer.

10. An inspection apparatus according to claim 9, wherein said upper plate member is a performance board.

11. An inspection apparatus according to claim 9, wherein said elastic members for elastically connecting said upper and lower plate members to each other are leaf springs.

12. A vacuum contactor mechanism comprising:

a contactor body having, on a lower surface thereof, a plurality of projecting terminals that can come into contact with electrodes of at least one semiconductor elements on a semiconductor wafer;

a dished space member configured to support said contactor body extending therethrough and forming a space that includes a portion of said contactor body that extends through said dished space member to project therefrom;

a seal member formed on a lower surface of a peripheral wall of said dished space member to come into contact with the semiconductor wafer, thereby maintaining air tightness of said space; and exhaust mechanism configured to exhaust, during inspection, a gas in said airtight space formed by said dished space member and the semiconductor wafer so as to set an interior of said airtight space to a low pressure to vacuum-chuck the semiconductor wafer and to bring the electrodes and said projecting terminals into contact with each other.

13. A vacuum contactor mechanism according to claim 12, wherein said contactor body is made of a material having a thermal expansion coefficient which is close to that of the semiconductor wafer.

14. A vacuum contactor mechanism according to claim 12, wherein a contactor body is electrically connected to a performance board through flexible printed circuit board, and said dished space member is connected to said performance board through a leaf spring.

15. A vacuum contactor mechanism according to claim 14, wherein said contactor body is made of a material having a thermal expansion coefficient which is close to that of the semiconductor wafer.

* * * * *